(12) United States Patent
Abrahamians et al.

(10) Patent No.: US 6,494,775 B1
(45) Date of Patent: Dec. 17, 2002

(54) WAFER CARRIER HAVING MORE SUPPORT RIBS AND LIGHTER WEIGHT AND METHOD

(75) Inventors: Edmond Abrahamians, Fremont, CA (US); Herb Wayne Owens, Jr., San Jose, CA (US); Vladimir Volovich, Mountain View, CA (US)

(73) Assignee: TSK America, Fremont, CA (US)

( * ) Notice: Subject to any disclaimer, the term of this patent is extended or adjusted under 35 U.S.C. 154(b) by 0 days.

(21) Appl. No.: 09/978,256

(22) Filed: Oct. 15, 2001

(51) Int. Cl.[7] .............................. B24B 47/02

(52) U.S. Cl. ...................... 451/398; 451/288

(58) Field of Search ................ 451/398, 285, 451/286, 287, 288, 289, 41, 397

(56) References Cited

U.S. PATENT DOCUMENTS

| 4,194,324 A | 3/1980 | Bonora et al. |
| 4,918,870 A | * 4/1990 | Torbert et al. ............. 51/131.3 |

* cited by examiner

*Primary Examiner*—George Nguyen
*Assistant Examiner*—Dung Van Nguyen
(74) *Attorney, Agent, or Firm*—LaRiviere, Grubman & Payne, LLP

(57) ABSTRACT

A lightweight, carrier for wafer-like objects, including semiconductor wafers, is provided. The carrier may be used to secure and position a wafer during various polishing processes. The improved design of the lightweight carrier includes a relatively high number of ribs and an annular flange having an annular protrusion to provide uniform load onto the wafer during polishing operations. The relatively lower weight of the carrier facilitate manual loading and unloading of it (the carrier) into and from the polishing machine.

17 Claims, 12 Drawing Sheets

WAFER CARRIER HAVING MORE SUPPORT RIBS AND LIGHTER WEIGHT AND METHOD

TECHNICAL FIELD

The present invention relates to a carrier used to support and protect semiconductor wafers during various manufacturing processes related to wafer polishing. More particularly, the present invention teaches an improvement in the carrier, including an increase in the number of support ribs and a lighter weight, to ensure high-quality results and facilitate automated or manual loading/unloading operations of the carrier.

BACKGROUND OF THE INVENTION

The semiconductor industry produces vast quantities of semiconductor wafers; i.e., thin slices of a semiconductive material used as a base for an electronic component or integrated circuit. Wafers comprise, for example, such materials as gallium arsenide, lithium niobate, sapphire, quartz and may be used in industries other than the semiconductor industry. Each wafer typically includes a flat, highly polished surface critical to formation of the integrated circuit and performance of the semiconductor. Wafers are polished to improve their surface quality, improve the uniformity of the wafer thickness, and ensure the integrity of the wafer. The geometry and quality of the surface, therefore, are an absolute prerequisite to product performance in this field of endeavor.

The industry currently relies on polishing machines to polish semiconductor wafers (hereafter, wafers). Typically, each machine is equipped with multiple heads mounted on the machine and each head is holding a carrier. The bottom part of the carrier resembles a flat disk. A template is affixed to it, usually by pressure sensitive adhesive (PSA). Templates are used to facilitate mounting of the wafers on the carriers.

During the process, a vertical force exerted on the heads of the machine brings the wafer into contact with a polishing pad of the machine. To polish the wafers, a surface of each wafer is brought into contact with the polishing pad. The heads rotate to provide a cycloidal movement to the wafers, and the polishing pad is subjected to a rotational force, such interaction between the wafer surface and the polishing pad causing the surface of each wafer to be polished.

Many polishing machines and carriers are built according to the design described in U.S. Pat. No. 4,194,324. The carriers of these machines and templates share general characteristics such as a relatively thin template having an outside diameter approximately equal to the diameter of the associated carrier. Most templates have round recesses, which accommodate approximately two thirds of a wafer, leaving a surface of the wafer exposed. The bottom of the recess of the template is designed to hold the wafer through water surface tension, adhesion or other means. Generally, the thickness of the material between the wafer and the carrier is uniform.

Issues abound with the current art, however. The load from the head to the carrier cannot be transferred uniformly due to the inventory of interacting components; e.g., head, o-ring, and carrier. A toroidal torsional load acts on the cross-section of the carrier as a result of the concentrated force from the head and distributed load from the wafers. Each of the aforementioned conditions produces aberrant finals results in the polished surface and the uniformity of the wafer. Such abnormalities preclude satisfactory construction conditions for the integrated circuit on the polished surface of the wafer. Additionally, the wafer carrier reception of load from the bottom of the head is concentrated only where carriers contain wafers and not to carriers empty thereof. This also results in a lack of uniformity of load and additional complexities in the carrier load condition. During the polishing operation, wear and friction heat is generated on the polished surface of the wafer. This heat transfers up through the thickness of the carrier and creates the undesirable effect of changing the shape of the carrier. Finally, and most importantly, the relatively heavy weight and cumbersome nature of the carriers unnecessarily encumbers the human operators charged with loading and unloading carriers to and from polishing machines.

What is needed, therefore, is a wafer carrier having acceptable structural and performance qualities that overcome the issues of the current art.

SUMMARY OF THE INVENTION

The present invention provides an improved carrier for disc-shaped objects such as semiconductor wafers, and a method for carrying such an object. The carrier boasts exceptional structural design and performance characteristics, including a particularly lightweight, highly maneuverable carrier that accepts and facilitates external forces to optimize results of polishing procedures. Additionally, the carrier of the present invention houses and protects the wafers to prevent degradation of quality, form, or value of the wafer relative to optimal polishing performance within predetermined tolerance specifications.

In one embodiment, the present invention includes a flexible plate; an annular vertical wall and a plurality of ribs. The plate provides a generally disk-shaped, relatively thin, flexible base for the carrier. An annular wall extends upward from the plate, the annular wall having an annular flange located on an upper part of the wall opposite the plate. The annular flange includes an annular protrusion and receives a load for polishing; a wafer. The ribs radially extend from the wall in a direction toward the perimeter of the plate and in a direction toward the center of the plate.

Further advantages of the invention will be brought out in the following portions of the specification, wherein the detailed description is for the purpose of fully disclosing preferred embodiments of the invention without placing limitations thereon.

DESCRIPTION OF THE INVENTION

Figure 1:
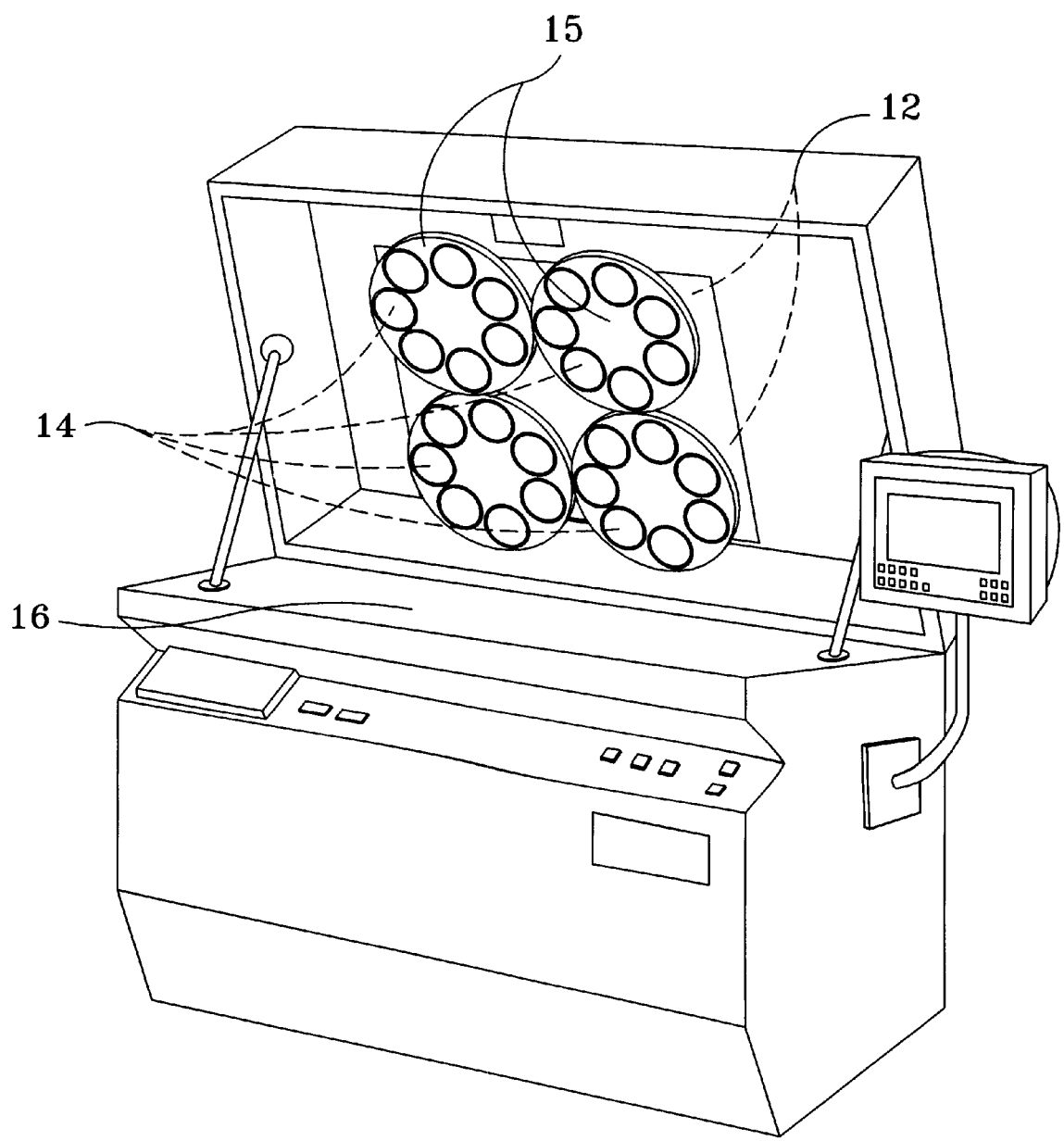
FIG. 1 is an illustration of a polishing machine, including carriers according to the present invention.
Figure 2:
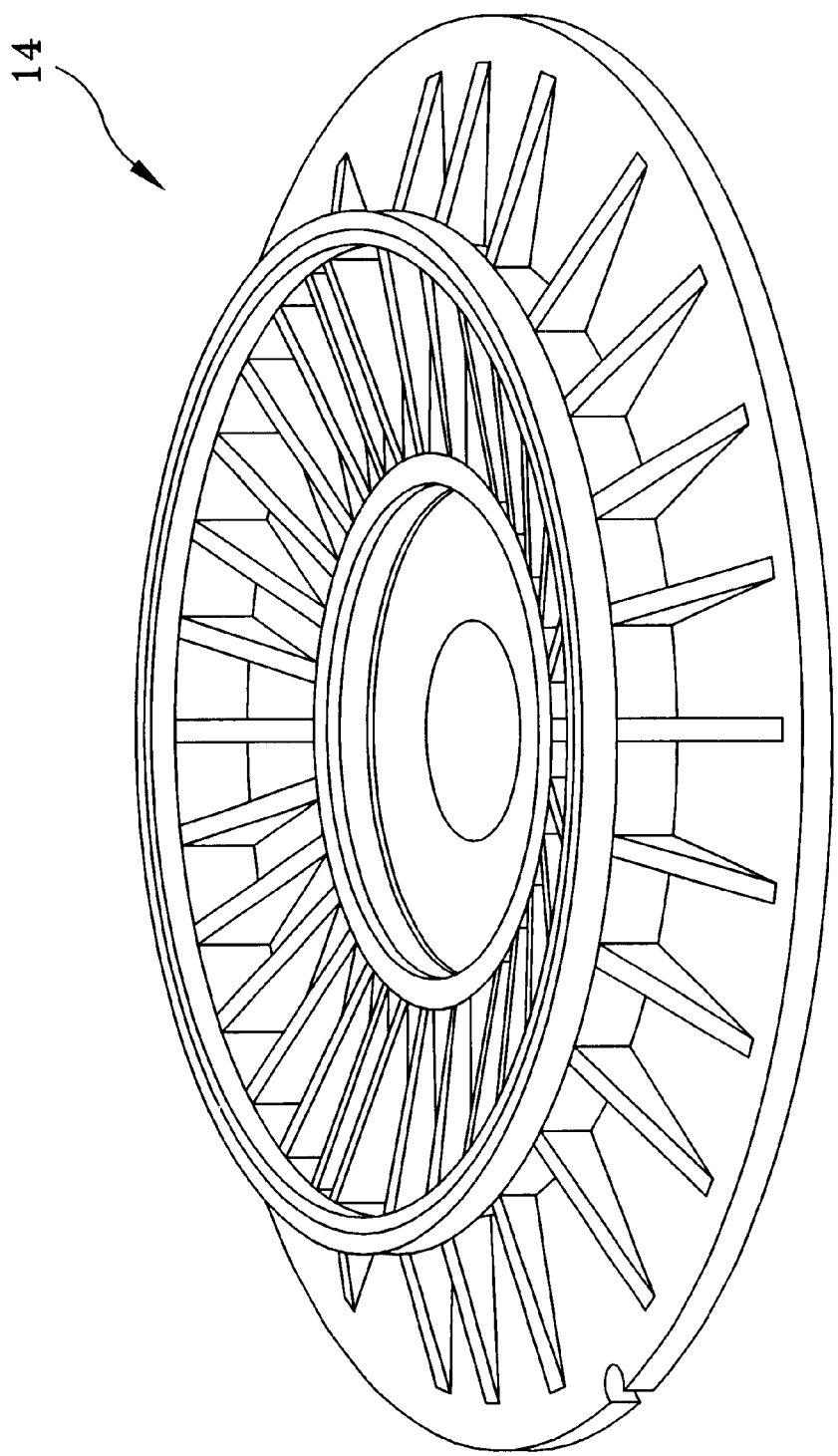
FIG. 2 is a schematic representation of a carrier of the prior art.
Figure 3:
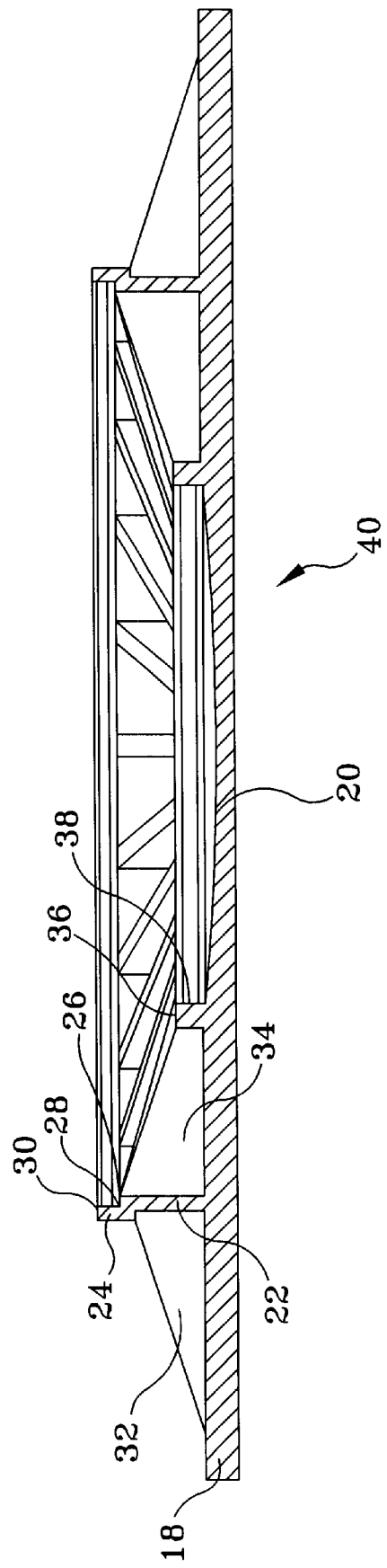
FIG. 3 is a sectional view of the prior art carrier shown in FIG. 2.
Figure 4:
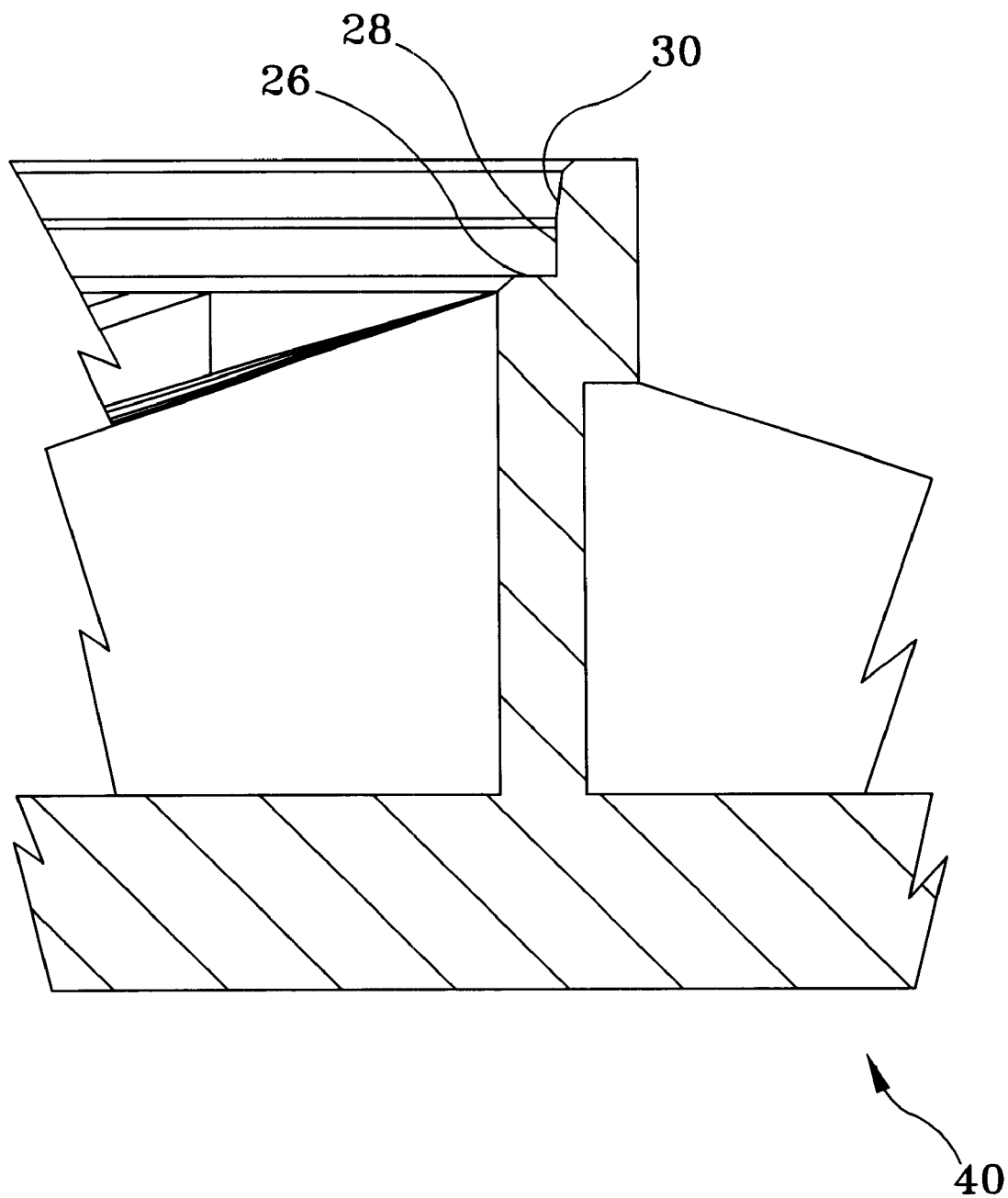
FIG. 4 is a sectional view of a portion of the prior art wafer carrier of FIG. 2.

Referring specifically to the drawings, wherein like references are made to the a same items throughout, for illustrative purposes the present invention is generally embodied in the method and apparatus depicted in FIGS. 1 and 5–7 of the drawings, as compared with drawings of the prior art in FIGS. 2–4. A skilled artisan will appreciate that the apparatus and method may vary as to the details of the parts, and that the method may vary as to the specific steps and sequence, without departing from the basic concepts as disclosed herein. Further, one skilled in the art will recognize that the methods and apparatus of the present invention contemplate the use of various components, alone or in combination.

Turning now to FIG. 1, there is shown generally at 10 an illustration of a polishing machine 10 having multiple heads 12 hidden behind carriers 14 (not visible) with templates 15 affixed to these carriers. Templates 15 are visible with round recesses for wafers (not shown). The shown machine 10 has four heads 12. Each head holds wafer carriers 14. The wafer carriers 14 are held on the head by means of a vacuum. Each wafer carrier 14, with template 15 attached to it, houses several semiconductor wafers (not shown). Carriers 14 are loaded or unloaded from polishing machine heads manually by an operator. During the polishing process an exposed face of each wafer, secured in its respective wafer carrier, is brought into contact with a polishing pad 16 by a vertical force transferred from each head 12 and exerted on the wafer carrier. The vertical force must sustain said contact between the exposed face of the wafer and the polishing pad 16 during the entire polishing process, wherein the polishing pad 16 and each head 12 provides friction via rotational forces to polish an exposed surface of the wafer.

Of significance, three conditions must be met to ensure high quality polishing results: first, the head 12 must uniformly transfer the vertical load to the exposed face of the wafer. This load is relatively high—at maximum values it could be as high as 5 p.s.i. to 8 p.s.i. Equally importantly, each wafer carrier 14 must accept the rotational action of the head 12, which rotates with the cycloidal movement of the wafers relative to the polishing pad 16. Finally, each wafer carrier 14 must accept horizontal forces while maintaining its stable position during the sliding motions associated with the rotating polishing pad 16. It is of the utmost importance to meet the aforementioned conditions; and, in order to ensure uniform thickness of the wafers, the facing surface of the wafer carrier 14 must be generally flat. Typically, in a freestanding position (without loaded wafers) the wafer carrier 14 could be to some degree concave (e.g. 0.005"–0.0015") but during working conditions; i.e., polishing operations, it should be generally flat. The conditions are generally difficult to meet for a variety of reasons. For example, the load from the head 12 might not be uniform because of interacting parts such as the head 12, the wafer carriers 14, and the "o"-rings (not shown) therebetween. Further the interacting parts may not have an ideal shape. Also, there is a toroidal torsional load acting on a cross-section of each wafer carrier 14, and such a load concentrated on the face of the head 12 needs equal distribution among the wafer carriers 14 to ensure uniform results for each wafer. In practice, as seen in wafer carrier of the prior art (hereafter described), the wafer reaction on the bottom of the wafer carrier 14 is concentrated in locations where there are wafers, creating an additional nonuniform load factor with respect to the wafer carrier 14 and additional complexity of the carrier load condition. Yet another issue arises during polishing operations: wear and friction heat is generated on the polished face of the wafer. This heat transfers to the wafer carrier 14 and raises the temperature of the wafer carrier 14 higher on its bottom surface. Nonuniformity of temperature distribution through the thick bottom plate of the carrier leads to undesirable deflection of the carrier bottom, which should be a substantially flat surface.

Turning now to FIG. 2, there is generally shown a schematic representation of a wafer carrier 14 of the prior art. With reference to FIG. 3, there is shown a sectional view of the prior art wafer carrier 14 shown in FIG. 2. For the purpose of clarity, the wafer carrier 14 of the prior art is shown consisting of several, integral components. The prior art structural design generally calls for a single, integral unit cast from an alloy such as aluminum or magnesium, resulting in a relatively thick, rigid structure.

The prior art wafer carrier has a flat platen 18 with central region 20 that is somewhat thinner than remainder regions of the platen 18. When loaded, the prior art wafer carrier contains the wafer under the base. In proximity to the area where the wafers are mounted there is a cylindrical wall 22 that terminates in a flange shown as an "L"-shaped cross-section 24, including a horizontal, ring-shaped flat surface 26, and a cylindrical surface 28 having a chamfer 30 section. The cylindrical surface 28 facilitates guidance of the wafer carrier 14 onto the head of the polishing machine during carrier installation. The chamfer 30 of the cylindrical surface 28 also facilitates this operation. External radial ribs 32 and internal radial ribs 34 form connective structures between the platen 18 and the cylindrical wall 22. A short, cylindrical rib 36 having an inside surface 38 has a diameter just slightly larger than the corresponding mating surface of the head. Because of this, the wafer carrier 14 is centered on the head (not shown) by the inside surface 38, with a guaranteed clearance therebetween. During the polishing process, the wafer carrier 14 should be pressed down by the head to the rotating polishing pad 16, and held there by a horizontal force from the head acting on the inner surface 38 of the wafer carrier 14. A bottom surface 40 of the platen 18 is also shown.

With reference to FIG. 4, there is shown a section view of a portion of the prior art wafer carrier of FIG. 2., wherein components ring-shaped flat surface 26, cylindrical surface 28, and chamfer 30 are shown in greater detail. The shape of the L-shaped cross-section 24 depicted in FIG. 3 produces a horizontal, ring-shaped flat surface 26 and cylindrical surface 28 in the wafer carrier 14. The ring-shaped flat surface 26 accepts all vertical load from the head (not shown) and also serves as surface for contact with an "o"-ring (not shown) of the head. Rotational torque from the head also transfers from the head to wafer carrier because of the frictional forces between the head, the "o"-ring and the carrier.

To provide the necessary flatness of the bottom surface 40 of the prior art wafer carrier 14, a structural design consisting of thick, rigid components is necessary with the assumption that if all components are rigid than all structure will be rigid. This structural design of thickness and rigidity comports with the assumption that if all the components of the prior art wafer carrier are thick, hard and unyielding, then the entire structure will be rigid. In direct contravention of the requirement for a lightweight carrier, all such prior art wafer carriers designed under this concept are heavy. For example, for a 200 mm. wafer, the weight of the carrier is approximately by 19–20 lbs. Such a weight severely inhibits the facile manual load/unload operations necessary for a streamlined polishing process, particularly during the iterative cycles of load/unload characteristic of a polishing machine. Thus it can be seen that facility and practicality of invention in the prior art models have been sacrificed in pursuit of production of a flat-bottomed model of wafer carrier.

By contrast, the present invention provides a revolutionary carrier incorporating all of the aforementioned desired characteristics via its improved design. The carrier of the present invention proves significantly lighter for ease of manual operations, while providing the structure necessary for high-quality polishing results, including the "chuck flatness"; i.e., uniformity of thickness, as described hereinafter.

Figure 5:
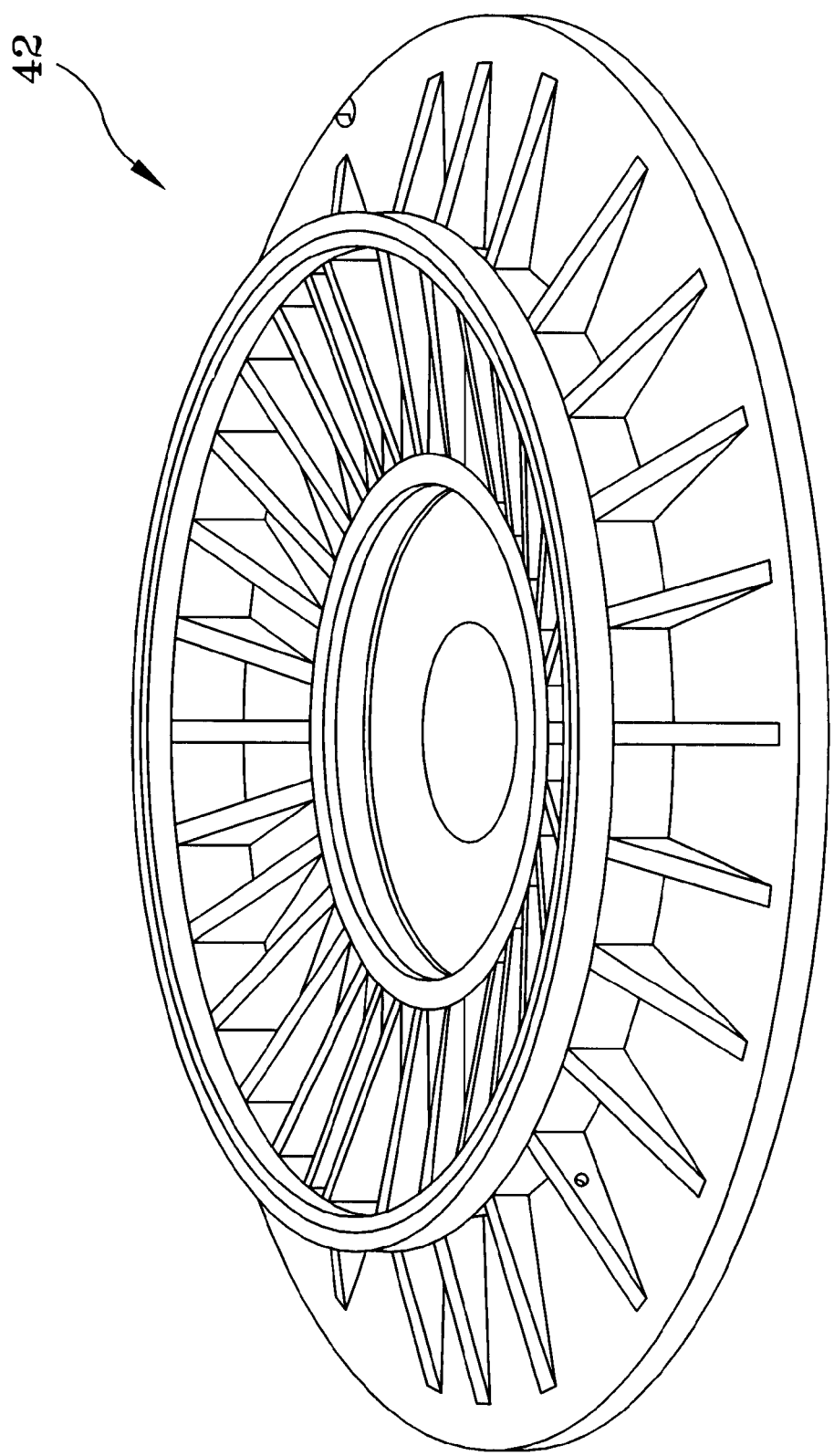
FIG. 5 is a schematic representation of a carrier according to the present invention.
Figure 6:
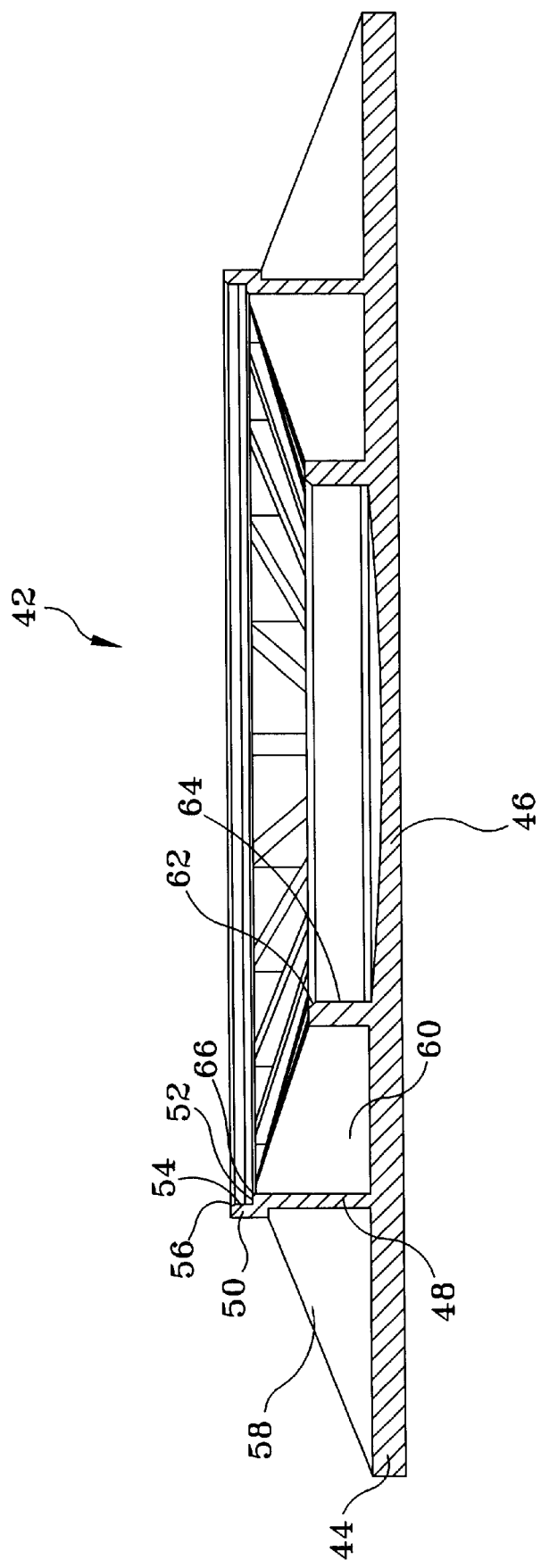
FIG. 6 is a sectional view of the carrier of the present invention shown in FIG. 5.

Turning now to FIG. 5, there is shown generally at 42 a schematic of an improved carrier according to the present invention. As shown in FIG. 6, via a cross-sectional view of the improved carrier 42 of FIG. 5, the improved carrier 42 includes a base 44 that acts as a base component for the improved carrier 42. The base 44 includes a central area 46. A vertical wall 48 arises from the base 44 in the general vicinity of the central area 46, the vertical wall typically having an annular shape, an "L"-shaped area 50 when viewed in cross-section, a flat, ring-shaped surface 52, a cylinder-like surface 54, and an associated bevel 56. A plurality of outer radial ribs 58 and inner radial ribs 60 are disposed between the base 44 and the vertical wall 48. A short rib 62 projects from the base 44, the short rib 62 having an inside surface 64. An annular protrusion 66 projects from the flat, ring-shaped surface 52 of the vertical wall 48.

Figure 7:
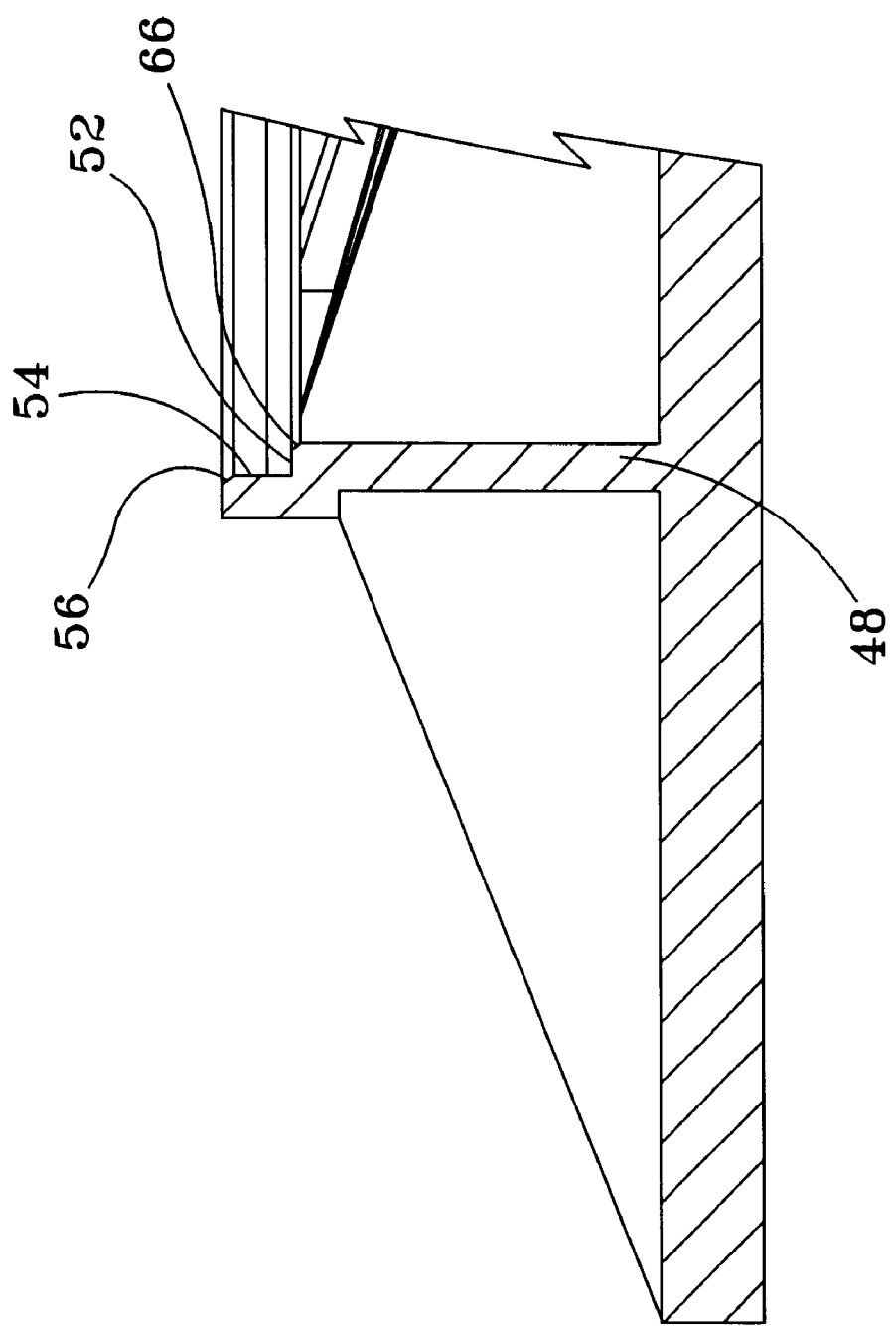
FIG. 7 is a section view of structural detail of a wall of the carrier of the present invention shown in FIG. 5.
Figure 8:
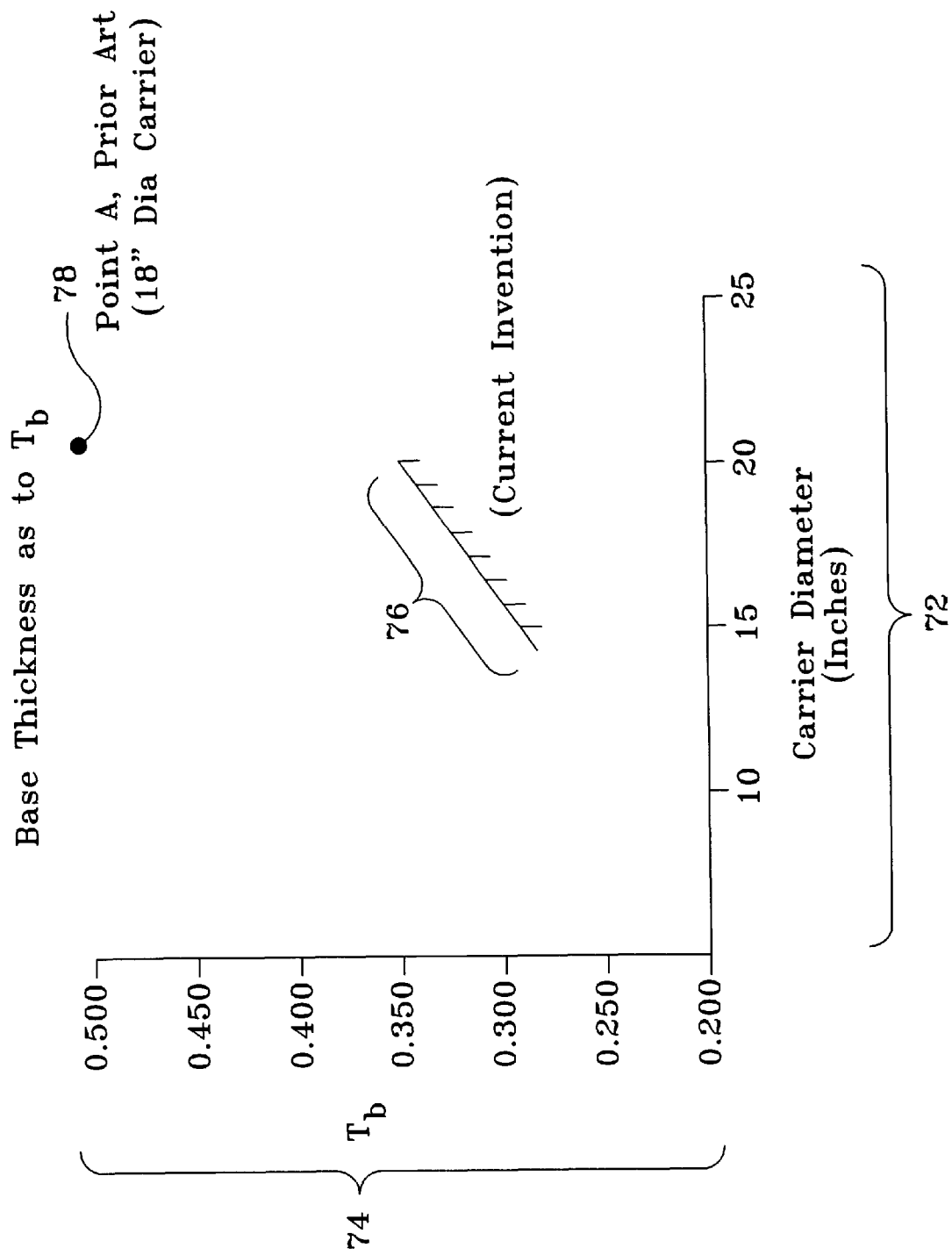
FIGS. 8–11 illustrate various charted data related to the present invention and the prior art.

With reference to FIG. 7, there is shown more particularly a sectional view of the improved carrier of the present invention shown in FIG. 5. The sectional view shows in sharp detail the structural relationship between the flat, ring-shaped surface 52, the cylinder-like surface 54, the bevel 56, and the annular protrusion 66 of the vertical wall 48.

The aforementioned objectives of the present invention are achieved by a unique core design scheme that is entirely opposite to the conventional design of prior art wafer carriers. Each element of the structure is designed with minimal thickness by eliminating the rigidity characteristic of each element, while providing the structural characteristics necessary to ensure top performance during polishing operations. The core design scheme of the present invention is explained as follows. The following formula f represents maximum deflection:

1.
$$f = \frac{ql^4}{384EI}$$

where: q represents a uniform load from wafer; l represents the distance between the radial ribs that translates vertical load from the head of the improved carrier base and then to wafer; E represents module elasticity of the carrier material; e.g., aluminum alloy; and I represents the moment of inertia of the base 44 cross-section.

2. The distance between the outer radial ribs as measured on the perimeter of the improved carrier is represented by the formula:

$$l = \frac{\pi D}{N},$$

where N represents the number of radial ribs. Further, in the formulaic equation 3 that follows, I can be represented as:

3.
$$I = \frac{bT_b^3}{12}$$

where b represents the unit of cross-sectional width and $T_b$ represents the thickness of the base 44.

Continuing with the improved carrier base load scheme, equations 1, 2, and 3 above are combined into one equation at 4 to extract the significant variables (all constants combining into one constant):

$$T_b = \frac{KD^{4/3}}{N^{4/3}}$$

To achieve a minimal weight for the improved carrier, the generally acceptable minimal thickness of the radial ribs $T_R$ for this kind of technology are in the range of 0.10"–0.18", depending on the size of the improved carrier, and, more particularly, taking into account this dependence:

$$T_R = K_R D^{1/3}$$

The weight of the radial ribs $W_R$ is accepted as generic representation of third power of linear dimension (in this case, the improved carrier diameter):

$$W_R \sim D^3$$

Therefore, taking into account total thickness of the ribs as $T_R \times N$ gives:

$$W_R \sim D^2 \times T_R \times N$$

Substituting "D" into $T_R$ and accepting N as unknown power x of "D" gives:

$$W_R \sim D^2 \times D^{1/3} \times D^X$$

From equations 6 and 8 there can be derived:

$$N \sim D^{2/3}$$

Combining equations 9 and 4, it can be shown that:

$$T_b = \frac{D^{2/3}}{K_b}$$

By applying formulaic equations 1, 10, 5, and 9 to the new concept of designing the improved wafer carrier, the oft-mentioned goals of the present invention are achieved in the following manner: by producing the base 44 of the improved carrier with minimal thickness determined by equation 11 shown below; by producing the radial ribs of the improved carrier with a minimal thickness $T_R$ (see equation 12 below) acceptable for this kind of technology; and by increasing the number of radial ribs to a number determined by equation 13 below:

11.
$$T_b < \frac{D^{2/3}}{K_b}$$

12.
$$T_R < \frac{D^{1/3}}{K_R}$$

where $T_b$, $T_R$ and D are in millimeters, $K_b$ is 185, $K_R$ is equal to 45; and 13.
$$N < \frac{D^{2/3}}{K_N}$$

where $K_N$ is equal to 1.7.

Turning now to FIGS. 8–11, various comparison data are shown. With regard to FIG. 8, there is illustrated a chart having an x-axis 72 directed to a diameter D in inches of the base of a carrier and a y-axis 74 directed to a base thickness, $T_b$. The solid line 76 shows a range of maximal base thickness $T_b$ corresponding to a range of diameters for the present invention and assuming a carrier for a 200 mm wafer where D=457 mm and for a carrier of the present invention for a 150 mm wafer, where D=375 mm. By comparison, Point A at 78 on the chart shows a prior art carrier having a base with a diameter D of 18", well within the range of the diameters plotted for the present invention. In contrast to the present invention, however, the base of the carrier having D=18" requires a much thicker base, resulting in a much heavier (and more rigid) carrier.

Figure 9:
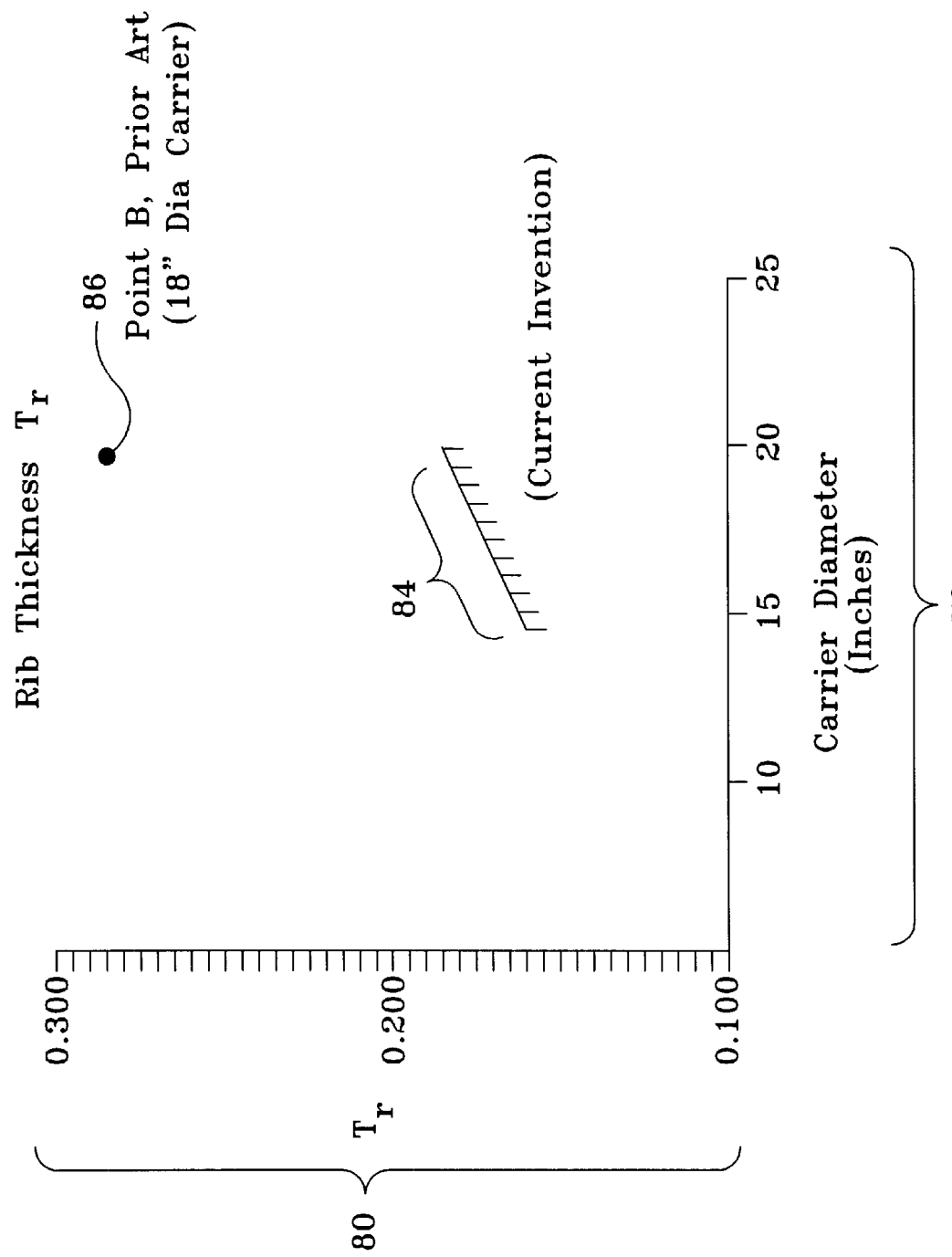

In FIG. 9 similar data is shown for a radial rib thickness as $T_R$. The axes are labeled with carrier base diameter D at 72 and $T_R$ at 80, while solid line 84 shows a range of maximal rib thickness corresponding to a range of diameters for the present invention and assuming a carrier for a D=457 mm and D=375 mm. By comparison, Point B at 86 on the chart represents the $T_R$ for a carrier of the prior art, where the prior art carrier has a diameter within the range of the present invention carriers mapped in this example; i.e., D=18". It is immediately apparent that the relative thickness (and rigidity) of the ribs is much greater for the prior art carrier than for the carriers of the present invention.

Figure 10:
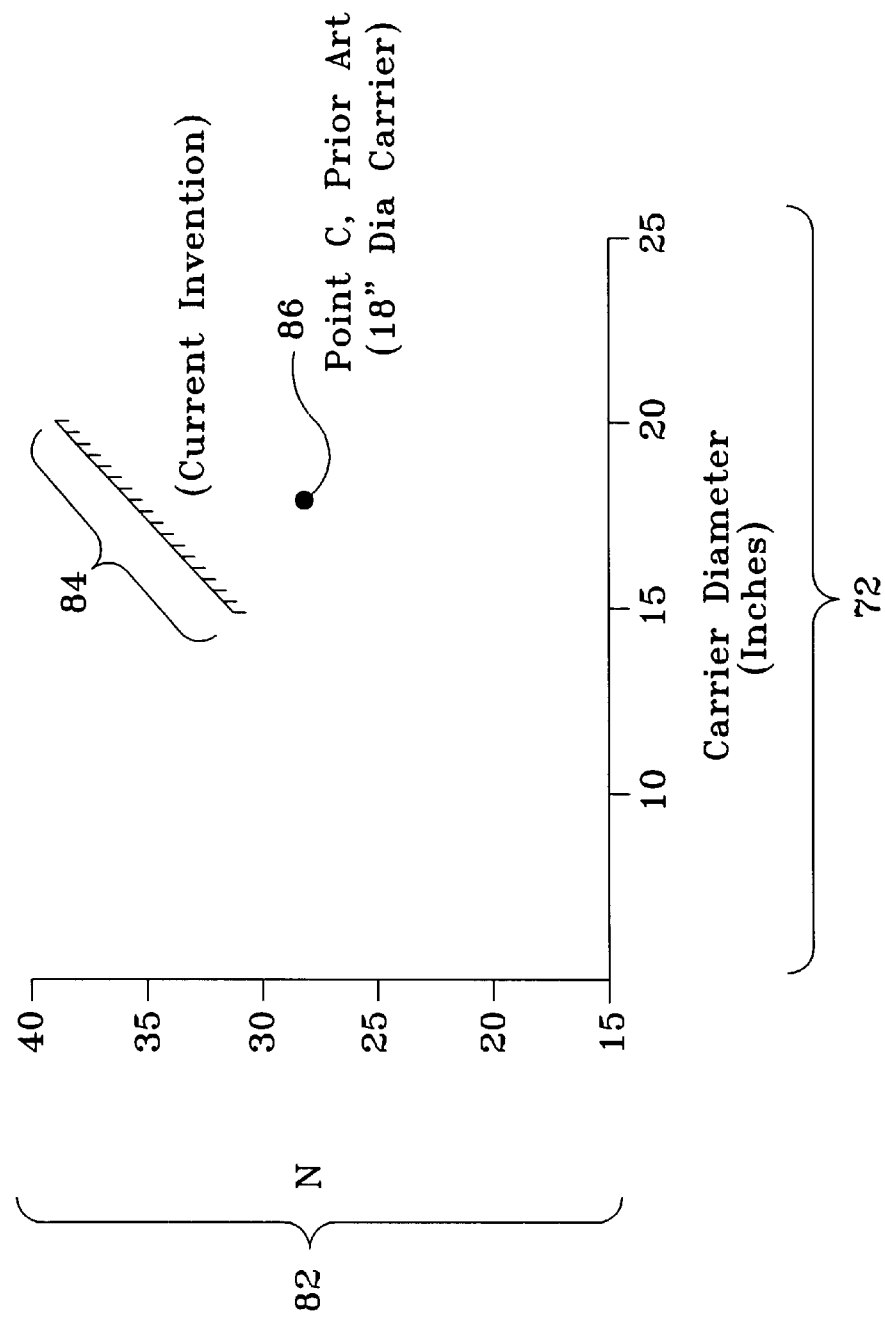

Shown in FIG. 10, the x-axis 72 remains the same as in the previous examples, and the y-axis at 82 represents the number (N) of ribs. The solid line 84 represents a range of N, D for the carriers of the present invention where N clearly outnumbers N of the prior art carrier as shown at Point C, 86.

Figure 11:
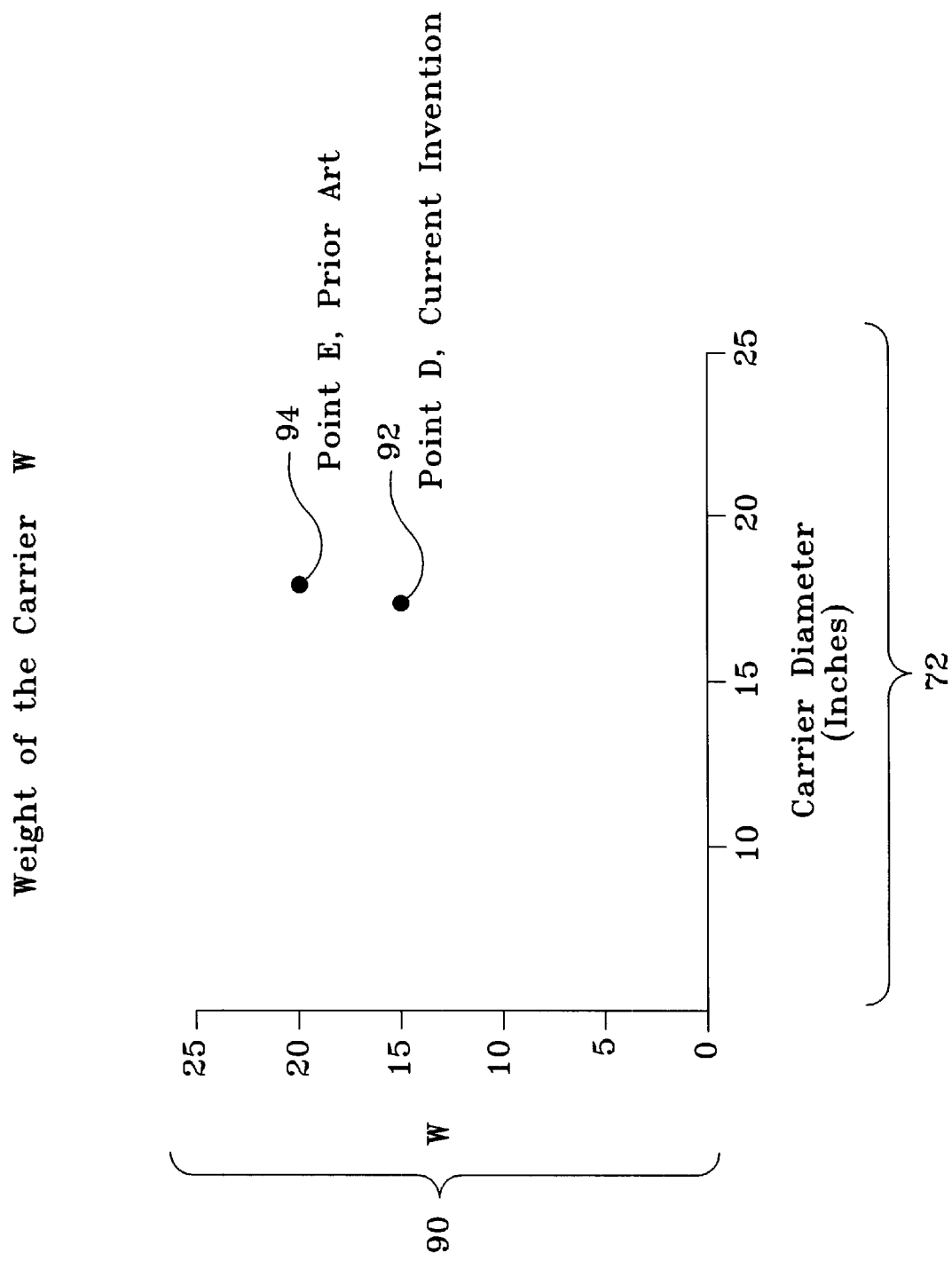

FIG. 11 illustrates comparison data of the weight of the present invention carriers and the prior art carrier, where the x-axis at 72 remains the same as in all prior examples of chart data, and the y-axis at 90 represents the weight in pounds of carriers with 10 an outside diameter 18" that accommodate wafers of 200 mm. The carrier of the present art weighs in at 14.5 lbs. as shown by Point D at 92, while the carrier for the prior art weighs in at 19.5 lbs. shown by Point E at 94. Most significantly, the improved carrier of the present invention weighs considerably less than the prior art carrier.

Figure 12:
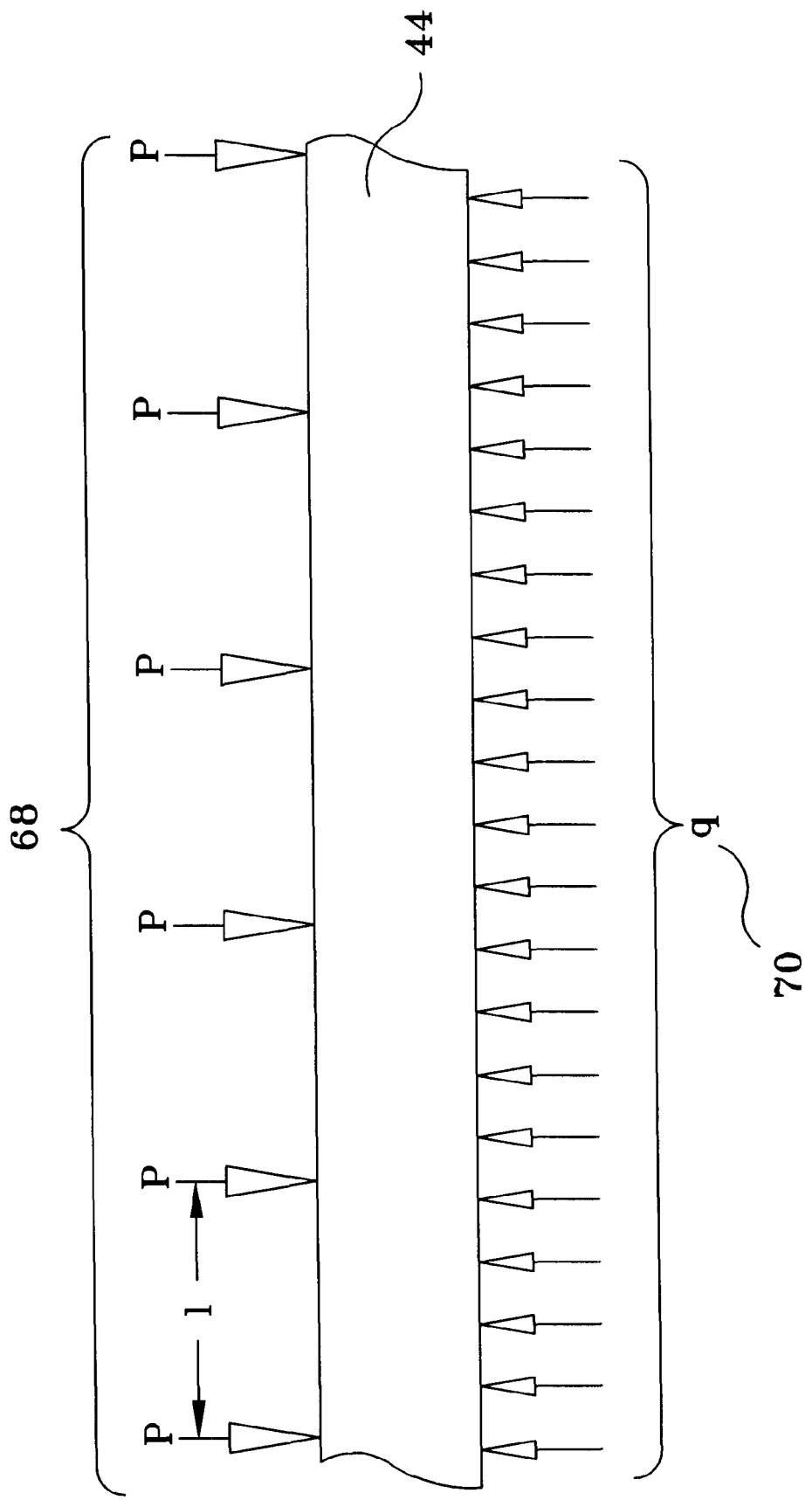
FIG. 12 is a schematic representation of a load scheme for a base of the carrier of the present invention.

With reference to FIG. 12, the load scheme of the improved carrier implies uniform distribution of the load from the head at 68 to the improved carrier, as depicted at 70, as well as corresponding uniform friction and generation of heat among carriers. The uniform distribution of the load from the head to the improved carrier achieves a significant improvement over the carriers of the prior art, where some of the load is transferred through an "o"-ring but a significant part is transferred through metal-to-metal contact of the head surface around "o"-ring, which cannot be uniform.

The present invention improves wafer carrier design, and, therefore performance, with the addition of the annular protrusion 66 associated with the flat, ring-shaped surface 52 of the vertical wall 48 directed inside an "o"-ring groove of the head, as shown in FIG. 7. In one embodiment of the present invention, the protrusion has trapezoidal shape in cross-section. The protrusion need not be large: 5% to 20% of the groove depth is sufficient to significantly increase load transfer through an "o"-ring and hence improve uniformity of the load on carrier, resulting in a substantially flat base when the improved carrier is loaded, a critical factor in ensuring high-quality polishing effects. The thin, flexible elements lighten the structure, as heretofore discussed, thereby facilitating loading/unloading operations. Thus, as one skilled in the art will note, the present invention provides substantial improvement over the carriers of the prior and current art.

Although the description above contains much specificity, these should not be construed as limiting the scope of the invention but as merely providing illustrations of some of the presently preferred embodiments of this invention. Thus the scope of this invention should be determined by the appended claims and their legal equivalents. Therefore, it will be appreciated that the scope of the present invention encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more". All structural, chemical, and functional equivalents to the elements of the above-described preferred embodiment that are know to those of ordinary skill in the art are expressly incorporated herein by reference and are intended to be encompassed by the present claims. Moreover, it is not necessary for a device or method to address each and every problem sought to be solved by the present invention for it to be encompassed by the present claims. Furthermore, no element, component, or method step in the present disclosure is intended to be dedicated to the public regardless of whether the element, component, or method step is explicitly recited in the claim. No claim element herein is to be construed under the provisions of 35 U.S.C. 112, sixth paragraph, unless the element is expressly recited using the phrase "means for".

What is claimed is:

1. A carrier for holding objects during polishing operations, the carrier comprising:
   a base having a bottom surface;
   a substantially vertical wall extending upwards from the base;
   a plurality of ribs radially extending inward and outward from the wall, each rib in the plurality of ribs connecting the wall with the base; and
   an annular flange having a flat surface and an annular protrusion, the annular flange extending from the wall such that the annular flange and the wall form a groove therebetween for receiving an o-ring whereby the annular protrusion contacts the o-ring.

2. The carrier of claim 1, wherein the objects further comprise substantially thin generically round wafers.

3. The carrier of claim 1, wherein the base further comprises a flexible base having a minimal thickness $T_b$ not exceeding value $D^{2/3}/K_b$, where D is the outside diameter in millimeters of the base and $K_b$ equals 185.

4. The carrier of claim 1, wherein each rib in the plurality of ribs has a minimal thickness $T_R$ not exceeding $D^{1/3}/K_R$, where D is the outside diameter in millimeters of the base and $K_R$ is equal to 45.

5. The carrier of claim 1, wherein the base further comprises a flexible base having a minimal thickness $T_b$ not exceeding value $D^{2/3}/K_b$, where D is the outside diameter in millimeters of the base and $K_b$ equals 185 and each rib in the plurality of ribs further comprises a minimal thickness $T_R$ not exceeding $D^{1/3}/K_R$, where D is the outside diameter in millimeters of the base and $K_R$ is equal to 45.

6. The carrier of claim 1, further comprising an annular protrusion projecting from a surface of the flange.

7. The carrier of claim 6, wherein the annular protrusion further comprises a substantially trapezoidally-shaped cross-section.

8. A carrier for holding a semiconductor wafer, the carrier comprising:
- a base having a minimal thickness $T_b$ not exceeding value $D^{2/3}/K_b$, where D is the outside diameter in millimeters of the base and $K_b$ equals 185;
- a substantially vertical wall extending upwards from the base, the wall having a substantially annular flange extending from the wall for receiving an object; and
- a substantially annular protrusion projecting from a surface of the flange, the annular protrusion spaced apart from the wall.

9. The carrier of claim 8 further comprising a plurality of ribs, the plurality of ribs having N ribs, where $D^{2/3}/K_N$, where $K_N$ is equal to 1.7.

10. The carrier of claim 8 wherein the annular protrusion further comprises a substantially trapezoidally-shaped cross-section with a height approximately equal to 5% to 20% of the depth of a head O-ring groove.

11. The carrier of claim 8, wherein the annular flange further comprises:
- a flat, ring-shaped surface;
- a cylinder-like surface interfacing with the flat, ring-shaped surface; and
- a bevel associated with the cylinder-like surface.

12. The carrier of claim 11, wherein the annular protrusion further comprises a height approximately equal to 5% to 20% of a height of the cylinder-like surface.

13. A method for retaining at least one object during a polishing process, the method consisting of the steps of:
- providing a base having a bottom surface;
- providing a substantially vertical wall extending upwards from the base, the wall having an annular flange with an annular protrusion such that the annular flange and the wall form a groove therebetween for receiving an o-ring whereby the annular protrusion contacts the o-ring; and
- providing a plurality of ribs radially extending inward and outward from the wall, each rib in the plurality of ribs connecting the wall with the base.

14. The method of claim 13, wherein the base further comprises a base having a minimal thickness $T_b$ not exceeding value $D^{2/3}/K_b$, where D is the outside diameter in millimeters of the base and $K_b$ equals 185.

15. The method of claim 13, wherein the plurality of ribs further comprises a plurality of ribs having N ribs, where $D^{2/3}/K_N$, where $K_N$ is equal to 1.7.

16. A method for using an improved wafer carrier during a polishing process, the method consisting of the steps of:
- receiving at least one object into the improved carrier comprising:
  - a base having a bottom surface;
  - a substantially vertical wall extending upwards from the base;
  - a plurality of ribs radially extending inward and outward from the wall, each rib in the plurality of ribs connecting the wall with the base; and
  - an annular flange having a flat surface and an annular protrusion, the annular flange extending from the wall such that the annular flange and the wall form a groove therebetween for receiving an o-ring whereby the annular protrusion contacts the o-ring; and
- retaining the at least one object for the duration of the polishing process.

17. The method of claim 16, wherein the base further comprises a base having a minimal thickness $T_b$ not exceeding value $D^{2/3}/K_b$, where D is the outside diameter in millimeters of the base and $K_b$ equals 185 and the plurality of ribs further comprises a plurality of ribs having N ribs, where $D^{2/3}/K_N$, where $K_N$ is equal to 1.7.

* * * * *